(12) United States Patent
Hang et al.

(10) Patent No.: US 6,882,669 B2
(45) Date of Patent: Apr. 19, 2005

(54) HIGH-POWER SURFACE EMITTING LASER AND FABRICATION METHODS THEREOF

(76) Inventors: Zhijiang Hang, 4 Liberty Ave., Lexington, MA (US) 02173; Victor Lazarev, 6 Baron Park La., Apt. 14, Burlington, MA (US) 01803

( * ) Notice: Subject to any disclaimer, the term of this patent is extended or adjusted under 35 U.S.C. 154(b) by 0 days.

(21) Appl. No.: 10/073,716

(22) Filed: Feb. 11, 2002

(65) Prior Publication Data

US 2002/0177246 A1 Nov. 28, 2002

Related U.S. Application Data

(60) Provisional application No. 60/267,905, filed on Feb. 10, 2001.

(51) Int. Cl.[7] .................................................. H01S 5/00
(52) U.S. Cl. ........................... 372/43; 372/45; 372/46; 438/25; 438/459
(58) Field of Search .............................. 372/43, 45, 46; 438/25, 459

(56) References Cited

U.S. PATENT DOCUMENTS

5,724,376 A  *  3/1998  Kish et al. .................... 372/96

* cited by examiner

*Primary Examiner*—Minsun Oh Harvey
*Assistant Examiner*—Cornelius H. Jackson
(74) *Attorney, Agent, or Firm*—O'Connell Law Firm (57) ABSTRACT

High powered lasers of substantially any wavelength produced by certain processes including the process of providing a structure comprising a substrate with an epi structure thereon comprising a gain region with multiple quantum wells, a mirror stack coupled to the gain region, and a conductive layer coupled to the mirror stack; dividing the conductive layer into a conductive, central area and one or more dielectric, peripheral areas; attaching a conductive plate to the conductive layer; thinning the substrate to improve the passage of light therethrough to produce a substrate remnant; and attaching an electrode to the substrate remnant.

19 Claims, 7 Drawing Sheets

HIGH-POWER SURFACE EMITTING LASER AND FABRICATION METHODS THEREOF

This application claims the benefit of Provisional application Ser. No. 60/267,905 filed Feb. 10, 2001.

FIELD OF THE INVENTION

The present invention relates to semiconductor diode lasers. More particularly, the present disclosure relates to Vertical External Cavity Surface Emitting lasers (VECSELs).

BACKGROUND OF THE INVENTION

Surface emitting lasers (SELs), which generate light in a direction perpendicular to their epitaxial structure, have several advantages compared to conventional semiconductor edge-emitting lasers (EELs). For example, the light beam of a SEL is circular and does not have a significant degree of astigmatism as compared to the beam of an EEL. As a result, the light from a SEL can be effectively coupled with optical fibers without any additional optical elements, which can be important for optical data communication. For the same reason, it can be focused into the small diffraction-limited spot that is necessary for optical data storage applications. Good beam quality of SEL light is also advantageous for the efficient conversion of light into the double-frequency spectral range with the use of nonlinear crystals.

By emitting light perpendicular to its wafer surface, a SEL allows for a relatively easy production of compact arrays of many lasers on the stage of wafer processing and before packaging. In this way, the problem of the relative alignment of elements is eliminated. Thanks to surface emission rather than edge emission, SELs can be tested on-chip before the wafer is diced up and packaged into individual components. With this, bad devices can be thrown out at an early stage of processing thereby cutting processing cost per wafer by up to 80% relative to an edge-emitting wafer.

SELs are generally represented by VCSELs (Vertical Cavity Surface Emitting Lasers). In VCSELs, the length of the laser cavity is limited by the thickness of its epitaxial structure and does not exceed a few wavelengths. To provide an emitted beam in only a single fundamental spatial mode, the diameter of the beam should be limited as well (by some microns). Therefore, the diameter of the active medium in the laser structure has to be limited also, which leads to a low level of output of VCSEL power (usually less than 10 mW). Larger area VCSEL emitters, with beam diameters on the order of 100 µm, can produce output beams having a few hundred mW of CW output power. However, operation of conventional VCSELs at high power and large diameter generally carries with it the penalty of an output beam having high-order spatial modes and multiple frequencies.

Another class of SELs, Vertical External Cavity Surface Emitting Lasers (VECSELs), are still under development. The main idea included in the VECSEL design is the extension of the laser cavity by the use of an external dielectric mirror as an output coupler. In this way, the diameter of the fundamental laser beam can be proportionally increased with the corresponding increase of the active laser medium diameter. Therefore, higher optical energy can be collected in the laser beam under proper pumping conditions. The strict requirement for the media pumping to produce the single-mode beam is the uniformity of optical gain distribution in the active zone.

Attempts to provide direct electrical pumping of the broad area of active layers in SEL structures have failed because of problems with uniformity of current distribution. Therefore, VECSELs are generally represented at this time by optically pumped SELs where the light of additional semiconductor lasers is absorbed by the active region of the SEL and optical gain is generated there. Because the gain distribution reflects the intensity profile of external laser beams, its uniformity is easily achieved in this way.

However, there are two main drawbacks of optically-pumped SELs. First, the plug-to-light efficiency is not so high as for VCSELs. This is the case because two stages of energy conversion are included. Furthermore, such devices are necessarily large as a result of extra lasers that are incorporated therein.

Recently, a new approach to VECSEL making was proposed as is described in International Publication Number WO 98/43329 to Mooradian for High Power Laser Devices. The device in that disclosure combines two kinds of pumping. In a first step, the current activates the central part of the active media. Then, the peripheral part of the media is pumped by photons generated during the first step.

Figure 1:
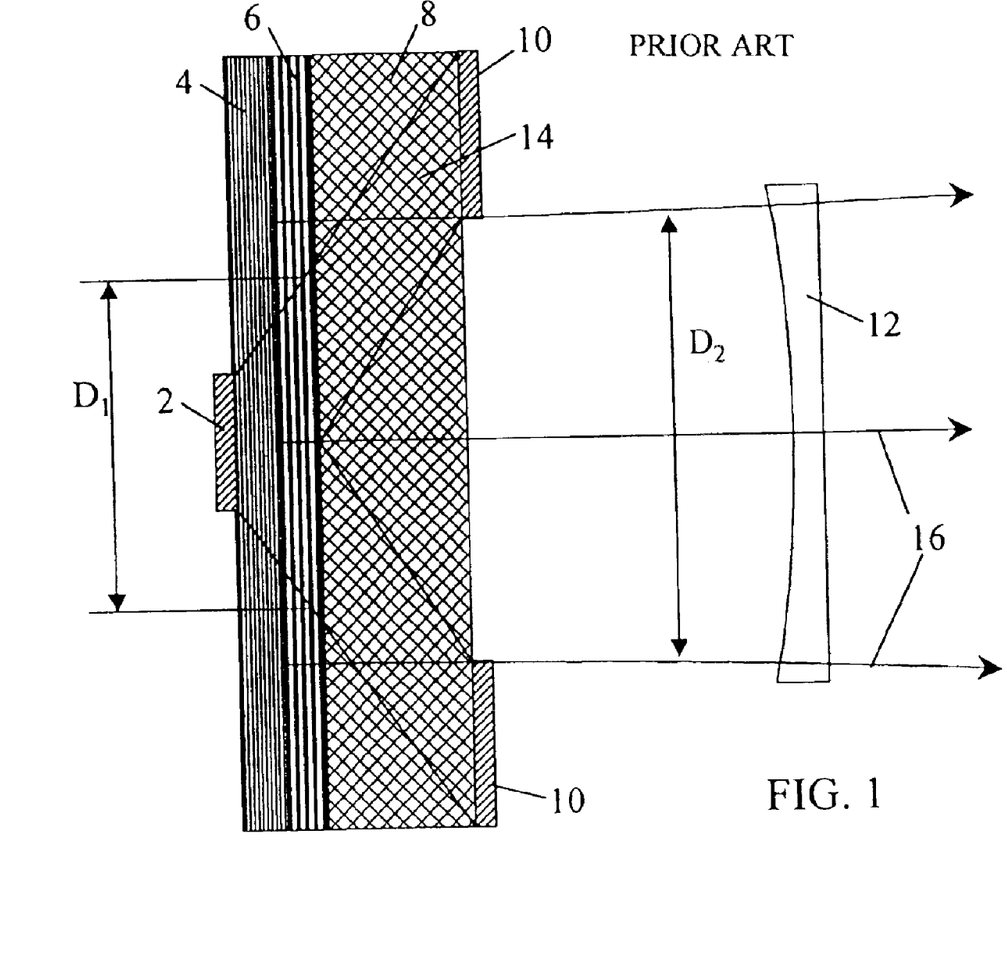
FIG. 1 is a schematic representation of a prior art electrically pumped HPSEL using a growth semiconductor substrate as a mechanical support.

As shown in the cross-section of FIG. 1, the device contains a SEL chip with gain layers 6 and reflective layers 4 grown epitaxially on the substrate 8. A circular contact or electrode 2 and an annular contact or electrode 10 are deposited on the opposite faces of the wafer. The resonant cavity is provided by a mirror stack 4 and an external mirror 12. The device generates output light 16. The gain area is pumped electrically thereby causing current to flow between annular contact 10 and circular contact 2. The resulting current flow 14 is generally conical in shape, with the base of the cone being at or near the annular contact 10 and the peak of the cone being at or near the circular contact 2. The current flow energizes a central part of the gain region with a diameter D1. The diameter D1 should be substantially larger than the thickness of the gain region 6.

The excited gain region of diameter D1 generates stimulated and spontaneous emission, which generally travels in any direction relative to the propagation of the cavity laser beam. However, since the transverse gain length is larger than the longitudinal gain length, more stimulated emission can occur in that direction. This transverse energy is absorbed in a second annular volume, which surrounds the first pumped volume. This absorbed energy serves to pump the second volume providing gain and, therefore, power into the fundamental laser mode with a diameter D2. The size of diameter D2 is determined by the position and shape of external mirror 12.

Figure 2:
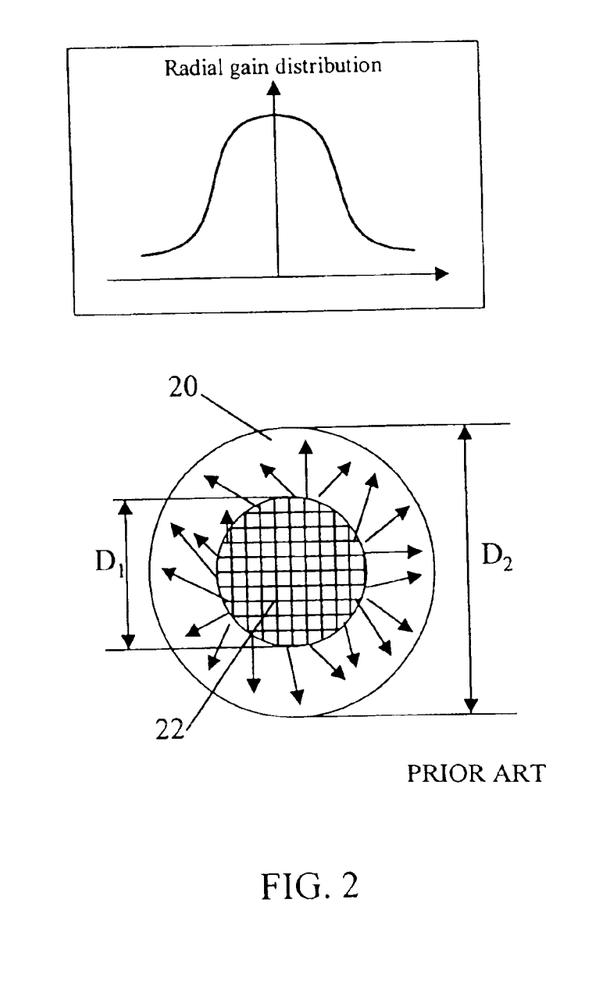
FIG. 2 is a schematic representation of a process of generating gain in active media when its central part is electrically pumped and of radial gain distribution.

A top view of the gain media 6 is shown in FIG. 2 where the central part 22 is pumped by current and provides the optical secondary pumping of annular region 20 by photons designated with arrows. The gain distribution over the area with diameter D2 is shown in the inset.

The abovedescribed prior art design resolved two problems that previously hindered the fabrication of high-power surface emitting lasers. First, the use of secondary optical pumping provides more uniform gain distribution than previously used attempts to activate bigger areas with current. As shown in FIG. 2, the flow of photons generated by current within the central area is averaged on angle and distance to the central area. In this way, the distribution of gain in the surrounding area becomes smooth and axially symmetrical thereby producing a single-mode output beam with high efficiency. Second, the numerous photons generated along the gain layer direction are not lost as in conventional SEL designs. Instead, they are used for secondary optical pumping of active media. Therefore, the efficiency of current-to-light conversion is increased.

However, there are some technical hurdles left unmet by the previously described device that limit its applications. One can see in FIG. 1 that the growth substrate 8 is the integral part of the design. It should be transparent to laser light. In most cases, however, the substrate material does not meet this requirement. As an example, GaAs is not transparent for light with a wavelength shorter than 870 nm, but it serves as a substrate growth for the epitaxial structure of SELs emitting light in the spectral range (650–850 nm).

As shown in FIG. 2, the radial gain distribution in the active media is still far from uniform. Also, the gain falls down at the borders of area with diameter D2. This is connected with electrical pumping of only the central part of the gain region.

An additional technical problem is connected with the necessity that the circular electrode 2 have a small size (<100 micron), which in turn should not contain any contacting electrodes disturbing its circular symmetry. Otherwise, the shape of current flow within the gain area will not be conical, and the output of the single-mode laser beam is decreased.

For these and further reasons, there remains a need for improvements in the art.

SUMMARY OF THE INVENTION

The principle object of the present invention is to improve the design of electrically pumped, high-power surface emitting lasers (HPSELs).

A more specific object of the invention is the design of HPSELs that are not limited in their generated wavelength.

Another specific object of the invention is the increase of HPSEL efficiency for single-mode beam generation by more uniform gain distribution in the active media.

A still further object of the invention is the improvement of HPSEL performance by more efficient dissipation of heat generated in its semiconductor structure.

These and further objects of the invention will be obvious not only to one skilled in the art who has reviewed the present written description and drawing figures but also to one who has an opportunity to make use of an embodiment of the present invention.

A preferred embodiment of the invention is achieved by the replacement of the growth substrate with a conductive plate, such as a metal plate, which serves as both an electrode and a mechanical support for the epitaxial structure. In this way, the emitted light is not absorbed by the substrate, and the HPSEL can be made for any wavelength of light generated by the active zone. Another advantage of this embodiment is the more uniform gain distribution in the active media compared to the prior art, which arises from a reduced distance between electrodes. Still another advantage of the proposed design is the effective heat dissipation provided by the metal plate located in close vicinity to the heat generating layers. The forming of a small electrode from the broad metal plate is made by selective oxidation of a specific layer in the epitaxial structure of the HPSEL.

A second embodiment of the invention includes the forming of a small electrode with metal plating of a hole etched through the substrate.

In a third embodiment of the invention, the growth substrate of the epitaxial structure is replaced by a plate of semiconductor material, which is transparent to the light generated by the laser. Again, the metal plate is used as a heat sink and as an electrode, while the current confinement in the gain media is provided by selective oxidation of a specific layer.

A fourth embodiment in accordance with the present invention includes a wafer fusion process to provide substrate replacement.

In a fifth embodiment of this invention, the replacement of substrates is achieved by a lifting off process.

One will appreciate that the foregoing discussion broadly outlines the more important features of the invention to enable a better understanding of the detailed description that follows and to instill a better appreciation of the inventors' contribution to the art. Before an embodiment of the invention is explained in detail, it must be made clear that the following details of construction, descriptions of geometry, and illustrations of inventive concepts are mere examples of the many possible manifestations of the invention.

DETAILED DESCRIPTION OF PREFERRED EMBODIMENTS

As is the case with many inventions, the present invention for High-Power Surface Emitting Lasers and Fabrication Methods Thereof is subject to a wide variety of embodiments. However, to ensure that one skilled in the art will fully understand and, in appropriate cases, be able to practice the present invention, certain preferred embodiments of the broader invention revealed herein are described below and shown in the accompanying drawing figures.

Figure 3:
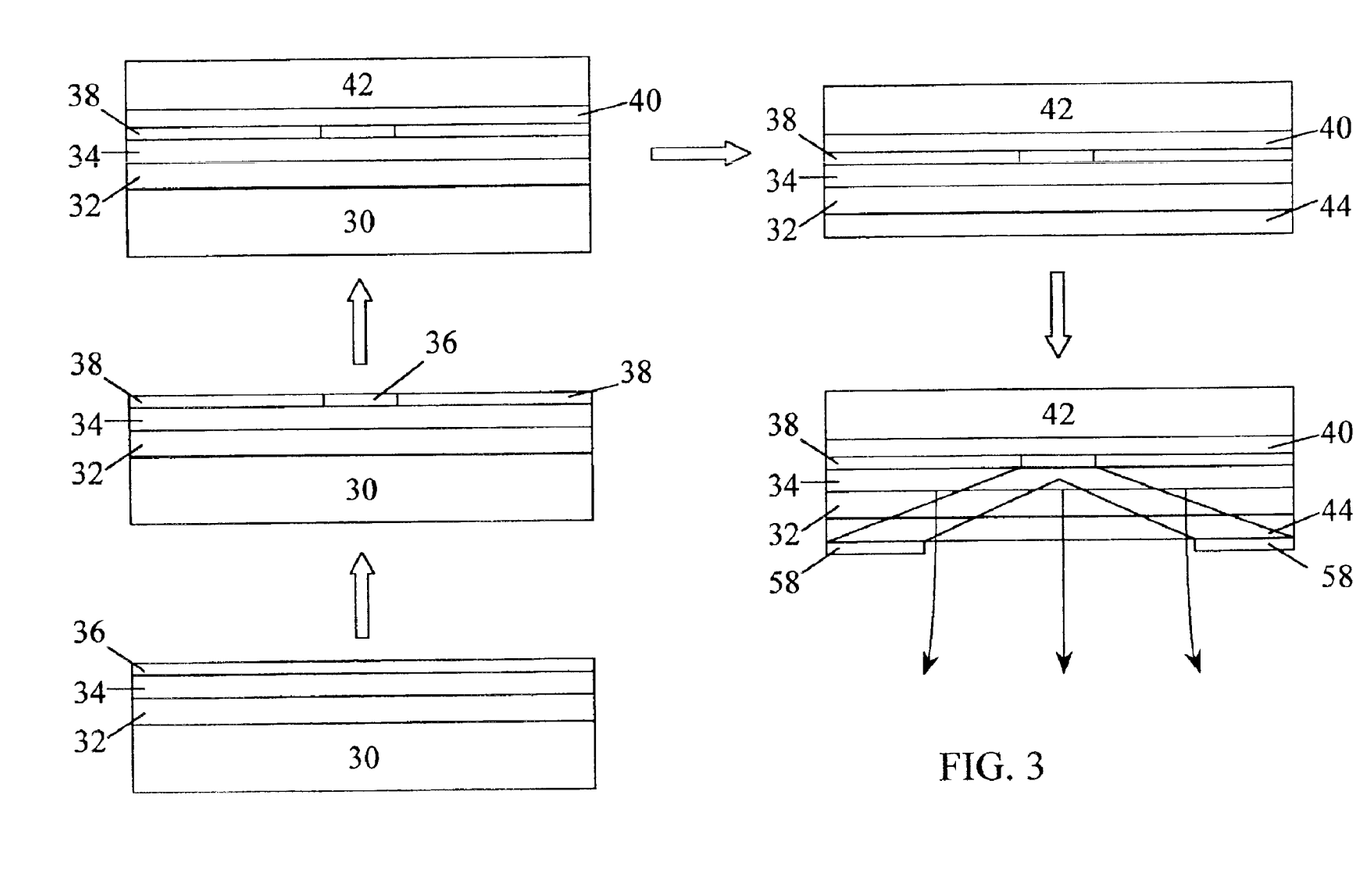
FIG. 3 is a schematic representation of a method of production of a HPSEL according to the present invention.

With this in mind, and looking more particularly to the drawings, FIG. 3 depicts steps in a process of HPSEL production under the present invention with the removal of the growth substrate and its replacement with a conductive plate, such as a metal plate, which serves both as an electrode and as a structural support for the grown epitaxial structure of the laser. In the first stage, the epi structure of the surface emitting laser (SEL) is grown on a substrate 30. The structure should contain multiple quantum wells (QW) in a gain region 32 and a distributed Bragg reflector (DBR) structure as a mirror stack 34.

Under this structure, the composition of the layers and their thicknesses depend on the desired wavelength. As an example, QWs for 850 nm are made with GaAs and interleaved with AlGaAs barrier layers. For 780 nm, both kinds of layers are made with AlGaAs alloys having different percentages of Al. Still further, QWs for 670 nm contain a GaInP alloy with AlGaInP barriers. Of course, one skilled in the art may conceive of alternative materials and desired wavelengths that each would be well within the scope of the present invention.

On top of the epi structure, one extra layer 36 is grown. In this case, it is made with AlAs and is used for the selective oxidation that follows. As one knowledgeable in the art will appreciate, the selective oxidation procedure is very well developed for the purpose of current confinement in conventional VCSEL production. Under this practice, a central area, which is also indicated at 36, of the layer can be left as the only conductive portion while the layer's peripheral parts 38 become dielectric.

In a further step, a plate 42, which ideally is relatively thick (about 1 mm) and formed from a conductive material, such as metal, is attached to the wafer by use of, for example, solder 40 as a conductive adhesive and by heating to an elevated temperature, such as about 300–400° C. Advantageously, that temperature range is low enough to keep the epi structure intact.

After bonding to the metal plate 42, the wafer is affected by a Chemical and Mechanical Planarization (CMP) process during which the substrate 30 is significantly thinned and polished. Preferably, the substrate remnant 44 will be reduced to or formed with a thickness of only some microns such that it will be sufficiently transparent to light emitted by the laser. An annular electrode 58 is deposited on the remnant 44 of the substrate 30 through a mask (not shown).

Under this construction, supplying voltage between electrodes 42 and 58 produces the current flow indicated in FIG. 3. Only the central small part of the thick electrode 42 will produce current because the oxidation process described above insulates the peripheral parts 38.

The proposed design solves the problem of the absorption of laser light by the substrate because it eliminates the substrate from the structure. The metal plate 42 is used as a structural support for the epitaxial layers and as an electrode. This design has a further advantage compared to the prior art. The thick electrode 42 positioned in the vicinity of the DBR structure 34 can effectively dissipate the heat produced mainly in the DBR structure 34 thereby serve as a heat sink.

In addition, the device shown in FIG. 3 produces more favorable current distribution in the gain area than did the prior art. One can see in FIG. 3 that the shape of the electrically pumped region of the gain area 32, provided by the current flow, is annular as compared to the circular shape in FIG. 1. This is accomplished by a significantly reduced distance between electrodes 42 and 58 in the design of FIG. 3 while the diameters of the annular electrodes 42 and 58 are close in both cases.

Figure 4:
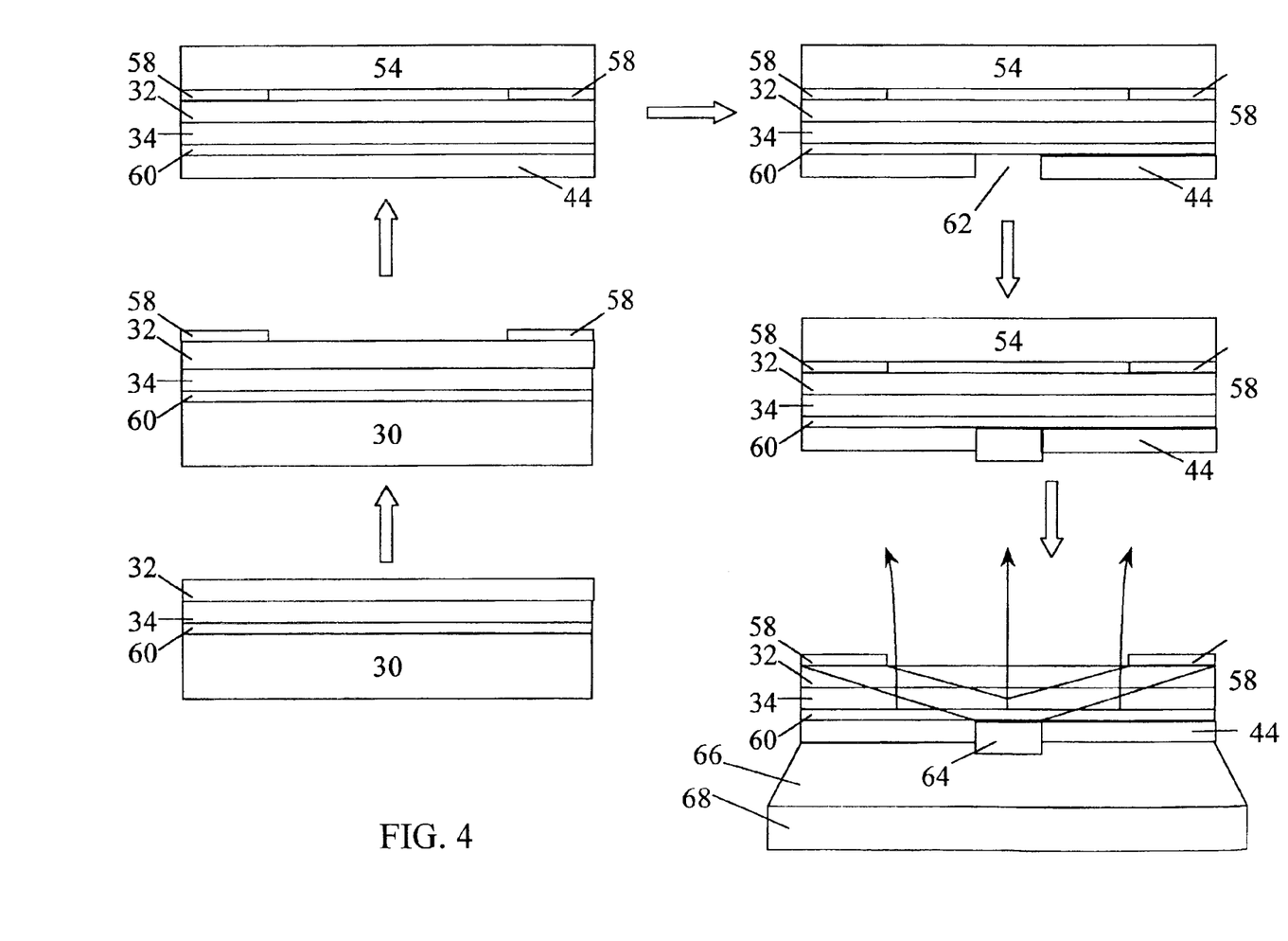

FIG. 4 shows a preferred sequence of steps in a process for producing a top-emitting HPSEL when the substrate is not located on the path of generated light. The making of a small electrode positioned in the vicinity of the active medium is achieved by making a hole through the substrate and plating that hole with a metal. There, the epi structure of a SEL with a desired wavelength is grown on a semi-insulating (undoped) substrate 30. As compared to the design of FIG. 3, DBR layers 34 are grown below the gain structure 32, and an additional etch-stop layer 60 (usually AlAs) is grown first in the epi structure. The annular electrode 58 is deposited on the gain layers 32. Then, a support layer 54, which may be made with a polymeric material, such as Apiezon W, is attached to the top of the epitaxial film.

The substrate 30 is significantly thinned, such as by a CMP process, so that the thickness of its remnant 44 is about 150 μm. A hole 62 with a diameter preferably equal to the required diameter of the circular electrode is made through the thinned substrate by a selective etching procedure. After that, metal is deposited onto the bottom and side walls of the hole 62 to provide the ohmic contact with the SEL structure. The hole is then filled with metal 64 with a plating process. A metal cylinder 64 provides the current supply to the SEL structure from its top surface only because it is surrounded by the insulating substrate 44.

This design advantageously provides current confinement as well as the oxide layer 38 does in the design shown in FIG. 3. The electrical contact of electrode 64 is provided by attachment of the SEL structure to the printed circuit board (PCB) 68 with conductive adhesive 66, such as a solder.

After that, the layer 54 as a mechanical support is not needed. Therefore, it is removed with a solvent, such as trichloroethylene.

Figure 5:
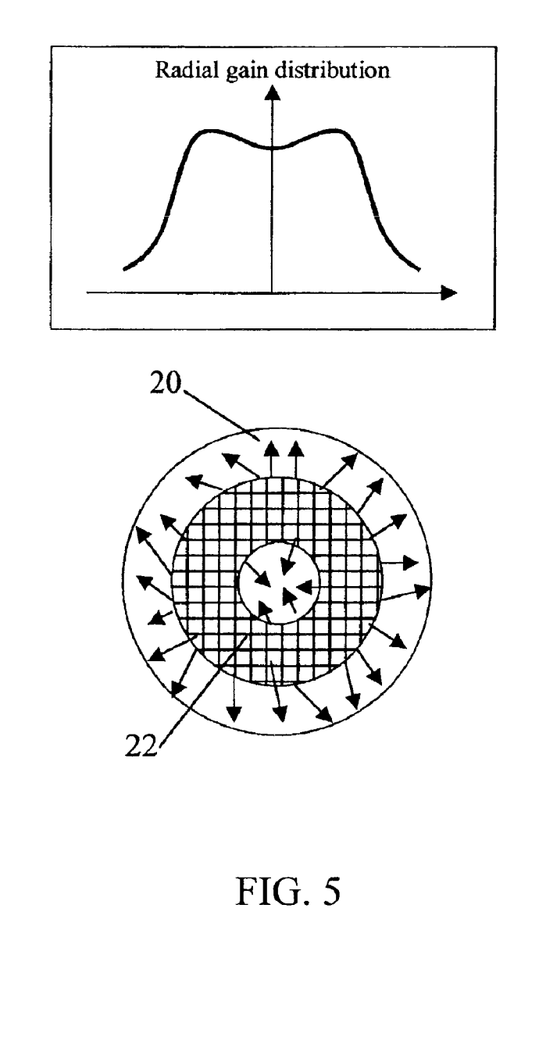
FIG. 5 is a schematic representation of the process of gain generation in the devices shown in FIGS. 3 & 4, and of radial gain distribution.

FIG. 5 depicts a process of secondary gain generation through optical pumping in the devices shown in FIGS. 3 and 4. As compared to FIG. 2, the photons generated by current in the annular area 22 propagate both to the central and the peripheral parts of the quantum wells. Therefore, due to optical pumping, they provide more uniform gain distribution in the area 20 than in prior art designs. This is illustrated in the inset of FIG. 5. With this, a higher efficiency of single-mode beam lasing can be achieved in the design according to the present invention.

Advantageously, the present inventors have further discovered that the problem of laser light absorption by the growth substrate can be solved in an alternative manner to the substrate removal process disclosed above. The growth substrate can be replaced with a plate made with semiconductor material, which will serve as a structural support and as a conductive material to provide the desired electrical gain activation. The electrode can be deposited on that new substrate. If the energy bandgap of the new substrate material is sufficiently broad, it will be transparent to laser light. GaP is a good candidate for the material of the new or replacing substrate because it does not absorb light with a wavelength longer than 600 nm. As a result, it is transparent to the emission of all SELs known to date.

Still further methods and structures for substrate replacement in HPSEL design have been employed by the present inventors and are within the scope of the present invention. For example, FIG. 6 demonstrates a further practice of the invention based on wafer fusion. This procedure is broadly used in making 1.3~1.5 μm VCSELs where InGaAsP quantum wells structure are bonded to GaAs/AlGaAs DBR layers. Recently, this process was successfully developed for the replacement of GaAs with GaP for a bottom-emitting VCSEL. This process also can be used for making a short-wavelength HPSEL.

Figure 6:
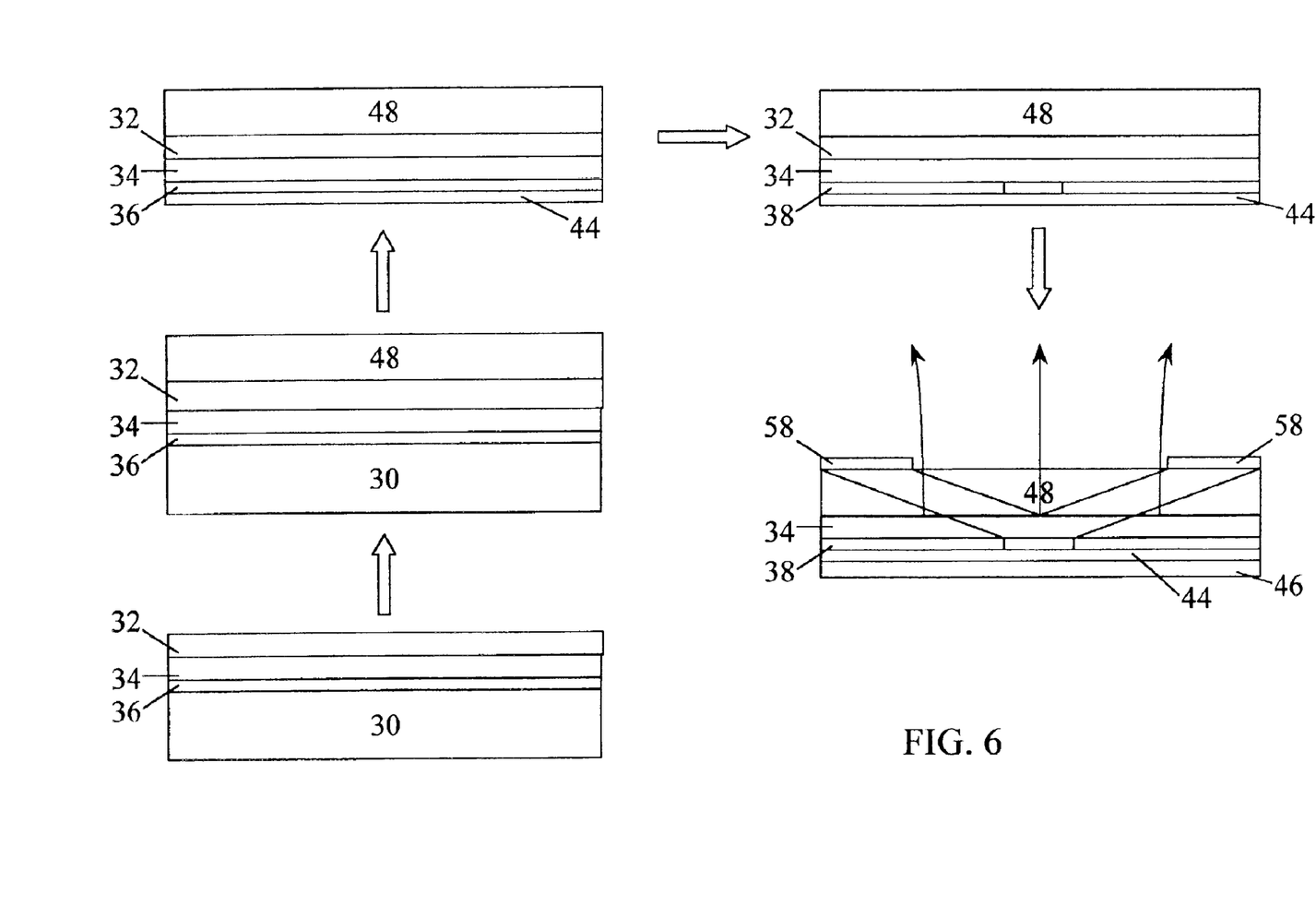
FIG. 6 is a schematic representation of a method of HPSEL production according to the present invention with the use of a wafer fusion process.

First, the epi structure of a SEL with a desired wavelength is grown on the substrate 30. As compared to the design of FIG. 3, DBR layers 34 are grown below the gain structure 32 and an additional oxide layer 36 is grown first in the epi structure. Wafer fusion is carried out by placing new wafer 48 on atop the gain structure 32 in a pressure fixture and keeping them in a dry nitrogen atmosphere for a sufficient length of time, such as 2 hours, at an elevated temperature, such as about 500–600° C. After they are bonded together, the original substrate 30 is thinned, such as to a ~10 μm thickness, by, for example, mechanical polishing and reactive ion etching. Selective oxidation of the layer 36 is conducted to provide the current confinement. The electrode 46 is deposited on the remnant 44 of the original substrate, and the annular electrode 58 is deposited on the surface of new substrate 48.

Figure 7:
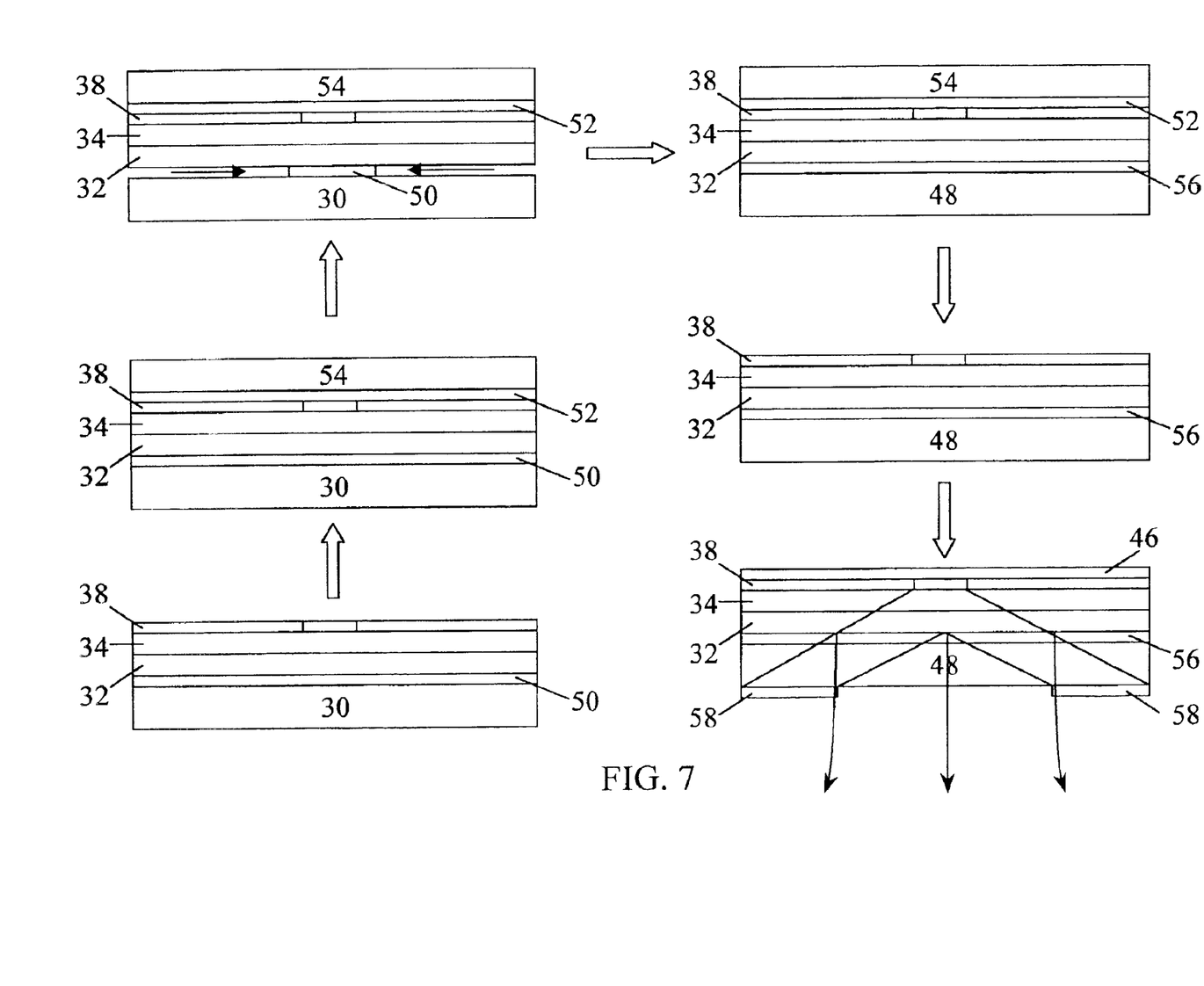
FIG. 7 is a schematic representation of a method of HPSEL production according to the present invention with the use of an epitaxial lifting-off process.

Still another contemplated way to replace the substrate is what may be called a lift-off technique, which is schematically presented in FIG. 7. The grown epi structure is similar to that shown in FIG. 3. However, the structure of FIG. 7 additionally contains what may be called a released layer 50 (usually AlAs), which will be destroyed later during the actual lift-off procedure. After the aforedescribed oxidation to providing confinement of current from the peripheral parts 38, the growth substrate 30 is replaced with a new substrate 48.

There are several ways to carry out the lift-off process that would be known to one of skill in the art. One such way is schematically depicted in FIG. 7 for making a HPSEL. First, a support layer 54, which may be made with a polymeric material such as Apiezon W, is attached to the top of the epitaxial film by use of adhesive 52. A uniformly thin channel is formed between the epitaxial film and the substrate 30 by, for example, using hydrofluoric acid (10%) to etch the release film 50. Internal tension of the support layer 54 due to heat curing causes compression under the film 50 thereby effectively lifting the edges and creating a concave curvature in the film 50.

In this way, gaseous products of the etching reaction can escape from the channel. The rest of the film 50 can then be etched away freeing the epitaxial film from the substrate 30. The released epitaxial film is adhered to a new substrate 48 with adhesive 56 or direct optical contact via strong Van der Waals forces. The support layer 54 along with adhesive 52 is removed with a solvent, such as trichloroethylene. After the lifting-off procedure, the electrode 46 is deposited on the oxide layer, and the annular electrode 58 is deposited on the new substrate 48.

From the foregoing, it will be clear that the present invention has been shown and described with reference to certain preferred embodiments that merely exemplify the broader invention revealed herein. Certainly, those skilled in the art can conceive of alternative embodiments. For instance, those with the major features of the invention in mind could conceive of or craft embodiments that incorporate those major features while not incorporating all of the features included in the preferred embodiments.

Accordingly, it will be clear that those with major features of the invention in mind could craft embodiments that incorporate those major features while not incorporating all of the features included in the preferred embodiments. Therefore, the following claims are intended to define the scope of protection to be afforded the inventors. Those claims shall be deemed to include equivalent constructions insofar as they do not depart from the spirit and scope of the invention.

It must be further noted that a plurality of the following claims may express certain elements as means for performing a specific function, at times without the recital of structure or material. As the law demands, these claims shall be construed to cover not only the corresponding structure and material expressly described in this specification but also equivalents thereof.

We claim as deserving the protection of Letters Patent:

1. A laser produced by the process of:
   providing a structure comprising a substrate with an epitaxial structure thereon comprising a gain region with multiple quantum wells, a mirror stack coupled to the gain region, and a conductive layer coupled to the mirror stack;
   dividing the conductive layer into a conductive, central area and one or more dielectric, peripheral areas;
   attaching a conductive plate to the conductive layer;
   thinning the substrate to improve the passage of light therethrough to produce a substrate remnant; and
   attaching an electrode to the substrate remnant;
   whereby the conductive plate can act as a mechanical support for the structure, as an electrode, and as a means for dissipating heat.

2. The laser of claim 1 wherein the step of attaching an electrode to the substrate remnant comprises attaching an annular electrode.

3. The laser of claim 1 wherein the mirror stack comprises a distributed Bragg reflector.

4. The laser of claim 1 wherein the gain region with multiple quantum wells is formed with GaAs interleaved with AlGaAs barrier layers whereby the quantum wells are suitable for light with a wavelength of approximately 850 nm.

5. The laser of claim 1 wherein the gain region with multiple quantum wells is formed with AlGaAs alloy layers of varying percentages of Al whereby the quantum wells are suitable for light with a wavelength of approximately 780 nm.

6. The laser of claim 1 wherein the gain region with multiple quantum wells is formed with GaInP alloy with AlGaInP barrier layers whereby the quantum wells are suitable for light with a wavelength of approximately 670 nm.

7. The laser of claim 1 wherein the conductive layer coupled to the mirror stack is made with AlAs.

8. The laser of claim 1 wherein the step of dividing the conductive layer into the conductive, central area and one or more dielectric, peripheral areas is carried out by selective oxidation.

9. The laser of claim 1 wherein the step of thinning the substrate comprises thinning the substrate to a thickness of approximately 10 $\mu$m.

10. The laser of claim 1 wherein the step of thinning the substrate comprises thinning the substrate to a thickness of approximately 150 $\mu$m.

11. The laser of claim 1 wherein the step of thinning the substrate comprises thinning the substrate by mechanical polishing and reactive ion etching.

12. The laser of claim 1 wherein the step of thinning the substrate comprises thinning the substrate to a thickness equal to or less than a combined thickness of the mirror stack, the gain region, and the conductive layer.

13. The laser of claim 1 wherein the step of thinning the substrate comprises thinning the substrate to a thickness equal to or less than a combined thickness of the mirror stack, the gain region, the conductive plate, and the conductive layer.

14. The laser of claim 1 wherein the conductive plate is attached to the conductive layer by conductive adhesive.

15. The laser of claim 14 wherein the conductive adhesive is solder and wherein the step of coupling the conductive plate to the conductive layer is carried out by heating the conductive adhesive, conductive plate, and conductive layer and maintaining the conductive adhesive, conductive plate, and conductive layer at an elevated temperature for a time sufficient to bond the conductive adhesive, conductive plate, and conductive layer together.

16. The laser of claim 1 wherein the conductive plate is approximately 1 mm in thickness.

17. The laser of claim 16 wherein the conductive plate is formed from metal.

18. The laser of claim 1 wherein the step of thinning the substrate to improve the passage of light therethrough to produce a substrate remnant is carried out by a Chemical and Mechanical Planarization (CMP) process.

19. The laser of claim 18 wherein the step of thinning the substrate comprises thinning the substrate to a thickness wherein it is substantially transparent to light emitted by the laser.

* * * * *